(12) United States Patent
Luo

(10) Patent No.: US 12,713,697 B2
(45) Date of Patent: Aug. 18, 2026

(54) DRIVE SUBSTRATES AND DISPLAY PANELS

(71) Applicant: SHENZHEN CHINA STAR OPTOELECTRONICS SEMICONDUCTOR DISPLAY TECHNOLOGY CO., LTD., Shenzhen (CN)

(72) Inventor: Chuanbao Luo, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 265 days.

(21) Appl. No.: 18/236,032

(22) Filed: Aug. 21, 2023

(65) Prior Publication Data

US 2025/0006746 A1 Jan. 2, 2025

(30) Foreign Application Priority Data

Jun. 30, 2023 (CN) ......................... 202310801687.8

(51) Int. Cl.
*H10D 86/60* (2025.01)
*H10D 86/40* (2025.01)
*H10H 20/857* (2025.01)
*H10W 90/00* (2026.01)

(52) U.S. Cl.
CPC ........... *H10D 86/60* (2025.01); *H10D 86/431* (2025.01); *H10D 86/471* (2025.01); *H10H 20/857* (2025.01); *H10W 90/00* (2026.01)

(58) Field of Classification Search
CPC .... H10D 86/60; H10D 86/431; H10D 86/471; H10D 30/6734; H10D 30/6755; H10D 86/40; H10D 86/421; H01L 25/0753; H01L 25/167; H10H 20/857; H10H 29/142;

(Continued)

(56) References Cited

U.S. PATENT DOCUMENTS

2020/0212221 A1 7/2020 Baeck et al.
2023/0187556 A1 6/2023 Huang
2024/0297243 A1* 9/2024 He ........................ H10D 10/231

FOREIGN PATENT DOCUMENTS

CN 115621304 A 1/2023

OTHER PUBLICATIONS

Chinese Office Action issued in corresponding Chinese Patent Application No. 202310801687.8 dated May 22, 2026, pp. 1-7, 15pp.

* cited by examiner

*Primary Examiner* — Mohammad A Rahman
(74) *Attorney, Agent, or Firm* — The Roy Gross Law Firm, LLC; Roy D. Gross

(57) ABSTRACT

Drive substrates and display panels are provided. In a thin film transistor of the drive substrate, a structure with double-gate and double-active layer is formed by a first active layer, a first gate, a first sub-gate of a second gate, and a part of a second active layer in an area adjacent to an output electrode; and a structure with single active layer and top gate is formed by a second sub-gate of the second gate and a part of the second active layer in an area adjacent to an input electrode. The first gate and the second gate together control a first channel of the first active layer and a first portion of a second channel of the second active layer.

20 Claims, 4 Drawing Sheets

(58) Field of Classification Search
CPC ........ H10H 29/30; H10H 29/41; H10H 29/39; H10K 59/1213; H10K 59/12; G09G 3/32
See application file for complete search history.

141
131
11
121

DRIVE SUBSTRATES AND DISPLAY PANELS

CROSS-REFERENCE TO RELATED APPLICATION

This application claims priority to Chinese Patent Application No. 202310801687.8, filed on Jun. 30, 2023, the disclosure of which is incorporated herein by reference in its entirety.

TECHNICAL FIELD

The present disclosure relates to the field of display technologies, and in particular, to drive substrates and display panels.

BACKGROUND

During the research and practice of the related art, it is found that when a thin-film transistor of a Mini-LED or Micro-LED panel is a top-gate type, on a condition that the gate of the thin-film transistor operates at a high voltage, such as at a voltage of about 30 volts, a temperature at an area where the thin-film transistor is located may be as high as 150 degrees Celsius. Under such a high-voltage operation, hot carriers in an oxide semiconductor of an active layer will deteriorate, resulting in a shift in a threshold voltage (Vth).

SUMMARY

In view of above, drive substrates are provided according to embodiments of the present disclosure. The drive substrate includes a base, a first gate, a first insulation layer, a first active layer, a second active layer, a second gate, a second insulation layer, an input electrode, and an output electrode. The first gate is disposed on the base. The first insulation layer is disposed on the base and covers the first gate. The first active layer is disposed on the first insulation layer and includes a first channel overlapping the first gate. The second active layer includes a second channel, a first contact portion, and a second contact portion. The second channel includes a first portion and a second portion connected with each other. The first contact portion is connected to a side of the first portion away from the second portion, and the second contact portion is connected to a side of the second portion away from the first portion. The first portion is directly connected to the first channel. The second portion and the first channel are both attached to the first insulation layer. The second portion is disposed on peripheral sides of the first channel and the first gate. The second insulation layer is disposed on the second active layer. The second gate is disposed on the second insulation layer and includes a first sub-gate and a second sub-gate connected with each other. The first sub-gate overlaps the first portion, and the second sub-gate overlaps the second portion. The input electrode is connected to the second contact portion, and the output electrode is connected to the first contact portion.

Display panels are further provided according to embodiments of the present disclosure. The display panel includes the above-mentioned drive substrate and a light emitting element disposed on the drive substrate, and the light emitting element is connected to the output electrode.

DETAILED DESCRIPTION

Technical solutions in the embodiments of the present disclosure will be clearly and completely described below with reference to the accompanying drawings. Obviously, the described embodiments are only some of the embodiments of the present disclosure, not all of them. Based on the embodiments in the present disclosure, all other embodiments obtained by those skilled in the art without making creative efforts belong to the scope of protection of this application. In addition, it should be understood that the specific implementations described here are only used to illustrate and explain the present disclosure, and are not intended to limit the present disclosure. In the present disclosure, unless stated to the contrary, the orientation terms such as “up” and “down” generally refer to up and down in an actual use or working state of the devices, and the terms “inside” and “outside” refer to an outline of an installation.

Embodiments of the present disclosure provide a drive substrate and a display panel, which will be described in detail below. It should be noted that a description sequence of the following embodiments is not intended to limit the preferred sequence of the embodiments.

Figures 1, 2:
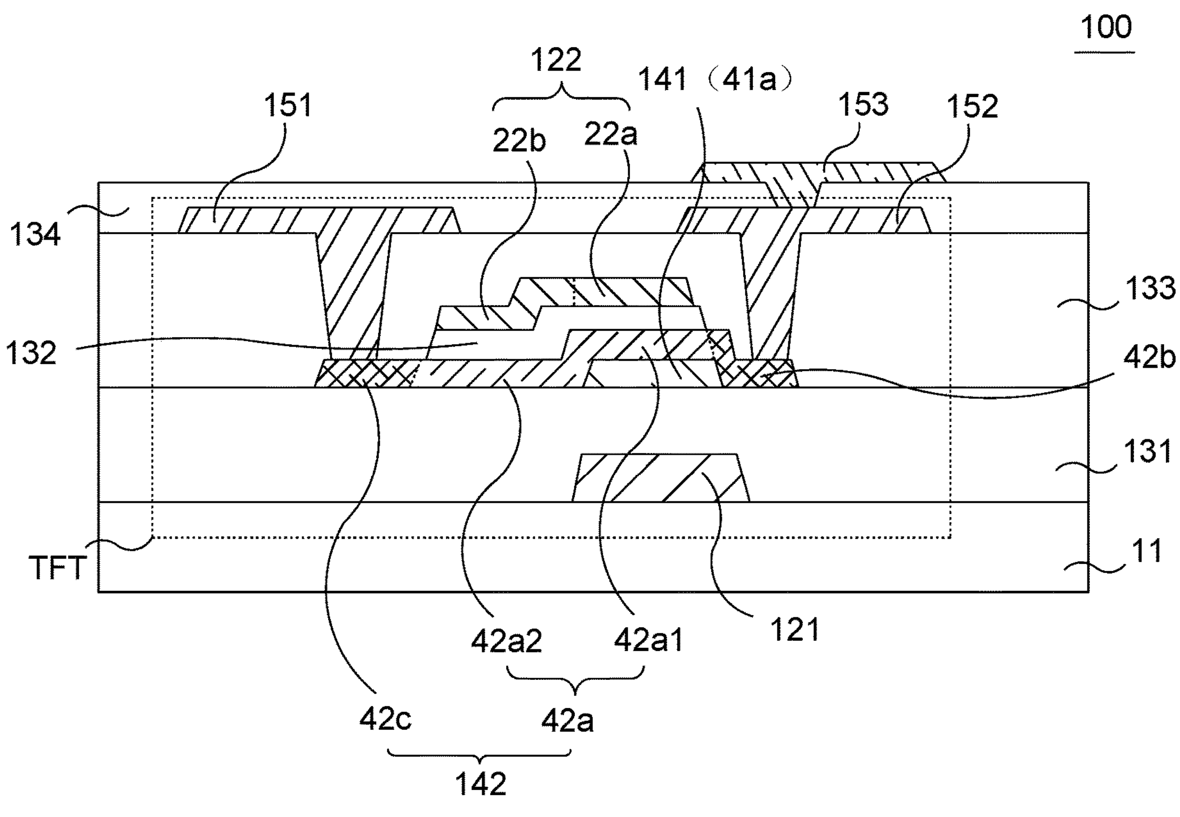
FIG. 1 is a structural schematic view of a drive substrate according to an embodiment of the present disclosure.
FIG. 2 is a schematic view of a structure corresponding to a step B11 of a manufacturing method of a drive substrate according to an embodiment of the present disclosure.

Referring to FIG. 1, a drive substrate 100 is provided according to an embodiment of the present disclosure. The drive substrate 100 includes a base 11, a first gate 121, a second gate 122, a first insulation layer 131, a first active layer 141, a second active layer 142, a second insulation layer 132, an input electrode 151, and an output electrode 152.

The first gate 121 is disposed on the base 11. The first insulation layer 131 is disposed on the base 11 and covers the first gate 121. The first active layer 141 is disposed on the first insulation layer 131. The first active layer 141 includes a first channel 41*a* overlapping the first gate 121.

The second active layer 142 includes a second channel 42*a*, a first contact portion 42*b*, and a second contact portion 42*c*. The second channel 42*a* includes a first portion 42*a*1 and a second portion 42*a*2 connected with each other. The first contact portion 42*b* is connected to a side of the first portion 42*a*1 away from the second portion 42*a*2. The second contact portion 42*c* is connected to a side of the second portion 42*a*2 away from the first portion 42*a*1. The first portion 42*a*1 is directly connected to the first channel 41*a*. The second portion 42*a*2 and the first channel 41*a* are both attached to the first insulation layer 131, and the second portion 42*a*2 is disposed on peripheral sides of the first channel 41*a* and the first gate 121.

The second insulation layer 132 is disposed on the second active layer 142.

The second gate 122 is disposed on the second insulation layer 132. The second gate 122 includes a first sub-gate 22*a* and a second sub-gate 22*b* connected with each other. The first sub-gate 22*a* overlaps the first portion 42*a*1. The second sub-gate 22*b* overlaps the second portion 42*a*2.

The output electrode 152 is connected to the first contact portion 42*b*. The input electrode 151 is connected to the second contact portion 42*c*.

In the thin film transistor TFT of the drive substrate 100 in the embodiments of the present disclosure, a structure with double-gate and double-active layer is formed by the first active layer 141, the first gate 121, the first sub-gate 22*a*, and a part of the second active layer 142 in an area adjacent to the output electrode 152, and a structure with single active layer and top gate is formed by the second sub-gate 22*b* and a part of the second active layer 142 in an area adjacent to the input electrode 151. Since the first gate 121 and the second gate 122 together control the first channel 41*a* of the first active layer 141 and the first portion 42*a*1 of the second channel 42*a* of the second active layer 142, a resistance and a voltage drop of the area are reduced, so that an electric field intensity of the area is weakened during operation, thereby suppressing the movement of the hot carriers and improving the stability of the threshold voltage (Vth) of the thin film transistor TFT.

In some embodiments, a material of the base 11 include one of glass, sapphire, silicon, silicon dioxide, polyethylene, polypropylene, polystyrene, polylactic acid, polyethylene dicarboxylate, polyethylene terephthalate, polyethylene naphthalate, polycarbonate, polyethersulfone, aromatic fluorotoluene containing polyarylate, polycyclic olefin, and polyimide or polyurethane.

In some embodiments, materials of the first active layer 141 and the second active layer 142 may be formed of single crystal silicon, polycrystalline silicon, or oxide semiconductor. The oxide semiconductor may include one of the oxides based on titanium, hafnium, zirconium, aluminum, tantalum, germanium, zinc, gallium, tin or indium, and their composite oxides (such as indium gallium zinc oxide, indium zinc oxide, zinc tin oxide, indium gallium oxide, indium tin oxide, indium zirconium oxide, indium zirconium zinc oxide, indium zirconium tin oxide, indium zirconium gallium oxide, indium aluminum oxide, indium zinc aluminum oxide, indium tin aluminum oxide, indium aluminum gallium oxide, indium tantalum One of germanium tin oxide, indium germanium gallium oxide, titanium indium zinc oxide, and hafnium indium zinc oxide).

In some embodiments, the materials of the first active layer 141 and the second active layer 142 are both oxide semiconductors.

In some embodiments, one of the input electrode 151 and the output electrode 152 is a source, and the other is a drain.

Optionally, in the embodiment, the first contact portion 42*b* and the first channel 41*a* are both attached to the first insulation layer 131, and the first contact portion 42*b* is connected to a lateral surface of the first channel 41*a*.

That is to say, the first active layer 141 only includes the first channel 41*a*. The first active layer 141 and the second active layer 142 share the first contact portion 42*b*, which may save materials and subsequent doping or ion implantation time.

In some embodiments, based on an upper surface of the first insulation layer 131, the first contact portion 42*b* is overlapped with the lateral surface of the first channel 41*a*, and a height of the first contact portion 42*b* is greater than a height of the first channel 41*a*.

That is, the first contact portion 42*b* is in oblique contact with the first channel 41*a*, which increases a contact area and also increases an area of the first contact portion 42*b*.

In some embodiments, a resistance value of the first contact portion 42*b* and a resistance value of the second contact portion 42*c* are both less than a resistance value of the first channel 41*a* and less than a resistance value of the second channel 42*a*.

Since the resistance value of the first contact portion 42*b* is less than the resistance value of the first channel 41*a* and less than the resistance value of the second channel 42*a*, a resistance value of the first contact portion 42*b* is less than a resistance value of an overlapping area of the first channel 41*a* and the second channel 42*a*, which may improve the conductivity of the thin film transistor TFT.

In some embodiments, a doping concentration of the first contact portion 42*b* is greater than a doping concentration of the second contact portion 42*c*. Such arrangement may have a stronger suppression effect on the carriers. A lower resistance may be achieved by doping more doping ions to the first contact portion 42*b*.

In some embodiments, in an orthographic projection of the drive substrate 100, both of a projection of the first sub-gate 22*a* and a projection of the first gate 121 completely cover a projection of the first channel 41*a* and a projection of the first portion 42*a*1. Such arrangement may improve a mobility of the thin film transistor TFT under a joint action of the first gate 121 and the second gate 122.

In some embodiments, a length of the first channel 41*a* is 15% to 30% of a length of the second channel 42*a*. Such arrangement makes a resistance value of an entire channel (the first channel 41*a* combined with the second channel 42*a*) presents a decreasing trend from the second portion 42*a*2 to an overlapping portion (the first portion 42*a*1 overlapping the first channel 41*a*) to the first contact portion 42*b*, which is conducive to weakening the electric field intensity of the area where the output electrode 152 is located without affecting the electric field of the area where the input electrode 151 is located, thereby ensuring the conduction effect of the thin film transistor TFT.

In some embodiments, the length of the first channel 41*a* may be 15%, 20%, 25%, or 30% of the length of the second channel 42*a*.

In some embodiments, a carrier concentration of the first active layer 141 is less than or equal to a carrier concentration of the second active layer 142. Since the second active layer 142 occupies a higher proportion as the channel, it covers an entire area of the channel and is located on a side of the first channel 41*a* adjacent to the second gate 122, so the carrier concentration of the second active layer 142 is higher, which may improve the mobility of the thin film transistor TFT.

On a condition that the thin film transistor TFT is N-type, the carriers are electrons. On a condition that the thin film transistor TFT is P-type, the carriers are holes.

In some embodiments, the drive substrate 100 may further include a passivation layer 134 and a conductive layer 153. The passivation layer 134 covers the input electrode 151 and the output electrode 152. The conductive layer 153 is disposed on the passivation layer 134 and connected to the output electrode 152.

In some embodiments, the conductive layer 153 may be served as a bonding pad for bonding a light emitting element.

In addition, a preparation process of the drive substrate 100 in the above embodiments is as follows.

Step B11, referring to FIG. 2, a first gate 121, a first insulation layer 131, and a first active layer 141 are sequentially formed on a base 11.

The first insulation layer 131 covers the first gate 121 and the base 11.

The first gate 121 may be a single-layer or a multi-layer stacked structure. For example, the first gate 121 may be Mo, Mo/Al, Mo/Cu, MoTi/Cu, MoTi/Cu/MoTi, Ti/Al/Ti, Ti/Cu/Ti, Mo/Cu/IZO, IZO/Cu/IZO, or Mo/Cu/ITO, etc.

The first insulation layer 131 is a buffer layer, which may be a single-layer or a multi-layer stacked structure, such as $SiO_x$, $Al_2O_3/SiN_x/SiO_x$, $SiO_x/SiN_x/SiO_x$, or the like.

The first active layer 141 includes an oxide semiconductor, such as IGTO, IGZO, IGO, IZO, AIZO, ATZO, or metal oxides doped with rare earth lanthanides.

Then a step B12 is subjected.

Figure 3:
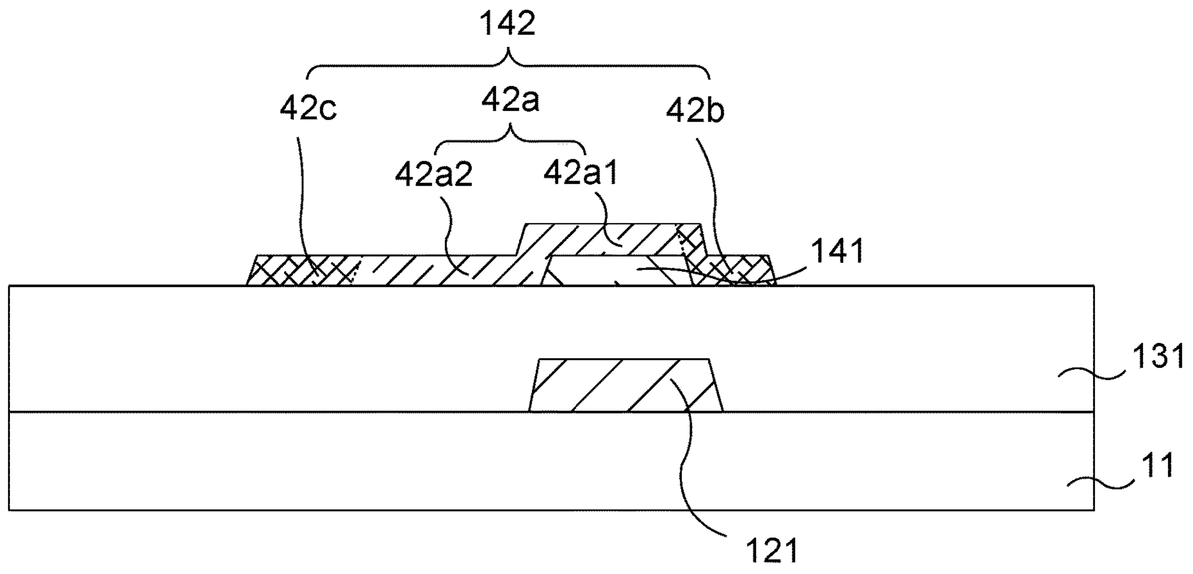
FIG. 3 is a schematic view of a structure corresponding to a step B12 of a manufacturing method of a drive substrate according to an embodiment of the present disclosure.

Step B12, referring to FIG. 3, a second active layer 142 is formed on the first active layer 141.

The second active layer 142 includes a second channel 42*a*, a first contact portion 42*b*, and a second contact portion 42*c*. The second channel 42*a* includes a first portion 42*a*1 and a second portion 42*a*2 connected with each other. The first contact portion 42*b* is connected to a side of the first portion 42*a*1 away from the second portion 42*a*2. The second contact portion 42*c* is connected to a side of the second portion 42*a*2 away from the first portion 42*a*1. The first portion 42*a*1 is directly connected to the first channel 41*a*. The second portion 42*a*2 and the first channel 41*a* are both attached to the first insulation layer 131, and the second portion 42*a*2 is disposed on peripheral sides of the first channel 41*a* and the first gate 121.

In some embodiments, the second active layer 142 includes an oxide semiconductor, such as IGTO, IGZO, IGO, IZO, AIZO, ATZO, or metal oxides doped with rare earth lanthanides.

Then a step B13 is subjected.

Figure 4:
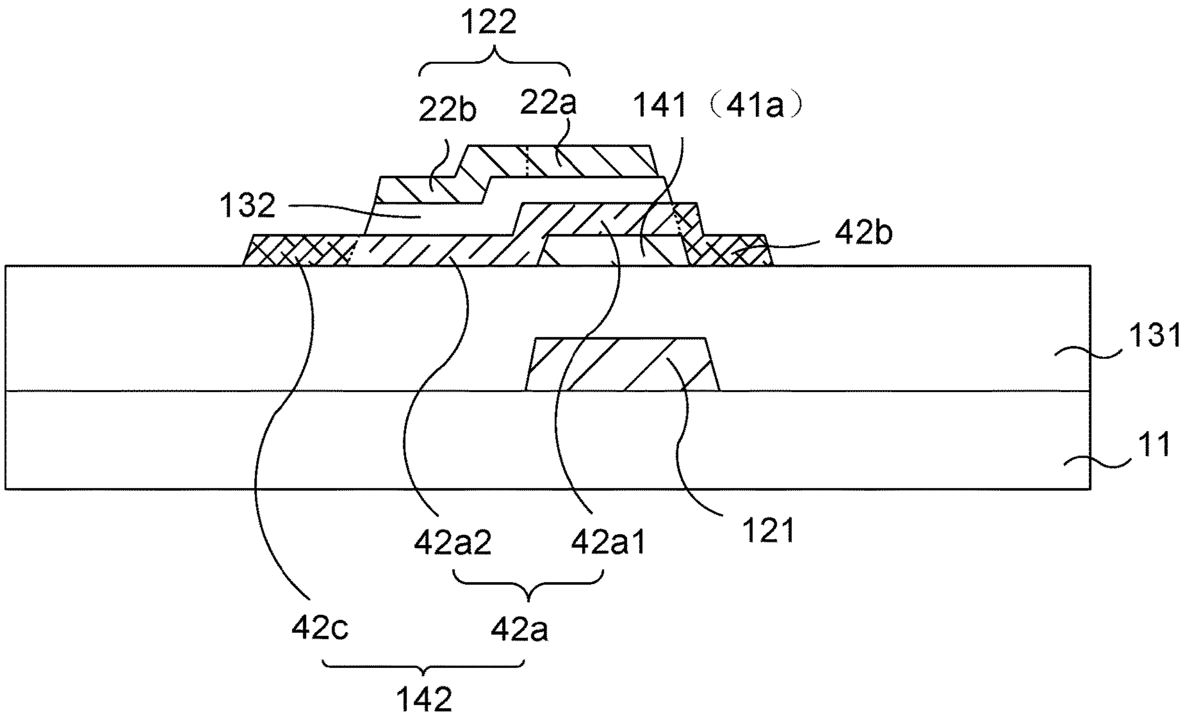
FIG. 4 is a schematic view of a structure corresponding to a step B13 of a manufacturing method of a drive substrate according to an embodiment of the present disclosure.

Step B13, referring to FIG. 4, a second insulation layer 132 and a second gate 122 are sequentially formed on the second active layer 142, and the first contact portion 42*b* and the second contact portion 42*c* are conducted by using the second gate 122 as a mask.

The second gate 122 blocks the first channel 41*a* and the second channel 42*a*, and exposes the first contact portion 42*b* and the second contact portion 42*c*. Subsequently, the first contact portion 42*b* and the second contact portion 42*c* are conducted by ion doping or ion implantation. The doped or implanted ions may be P-type or N-type.

In some embodiments, a material of the second insulation layer 132 may be $SiO_x$, $Al_2O_3/SiN_x/SiO_x$, $SiO_x/SiN_x/SiO_x$, or the like.

The second gate 122 may be a single-layer or a multi-layer stacked structure. For example, the second gate 122 may be Mo, Mo/Al, Mo/Cu, MoTi/Cu, MoTi/Cu/MoTi, Ti/Al/Ti, Ti/Cu/Ti, Mo/Cu/IZO, IZO/Cu/IZO, or Mo/Cu/ITO, etc.

Then a step B14 is subjected.

Figure 5:
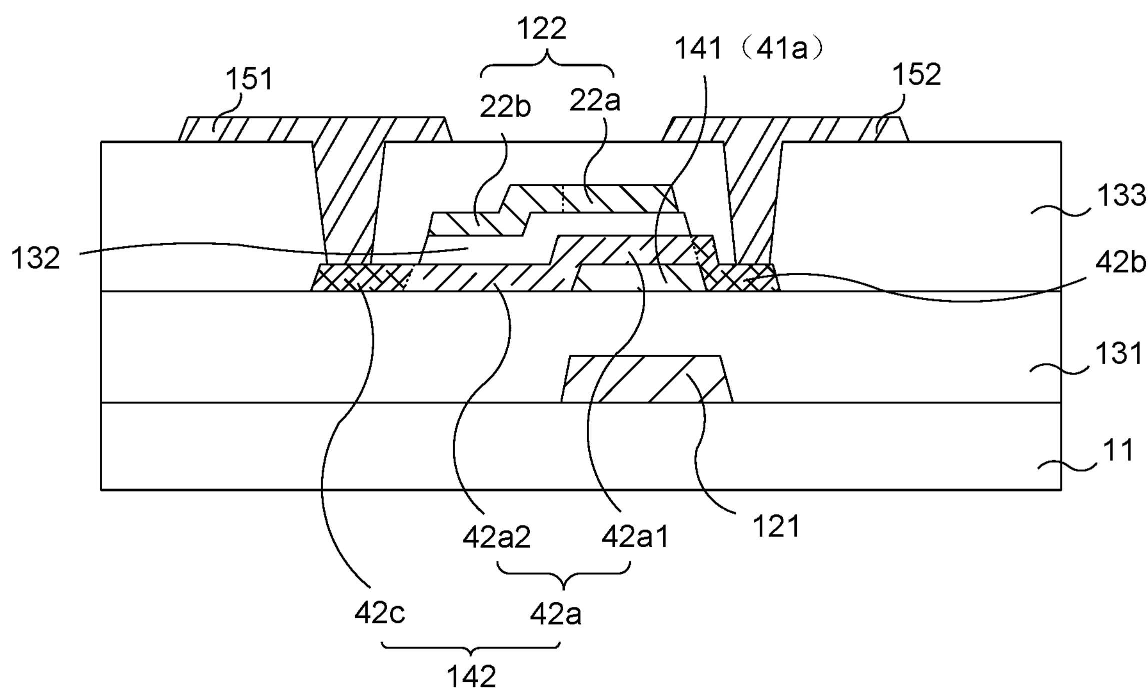
FIG. 5 is a schematic view of a structure corresponding to a step B14 of a manufacturing method of a drive substrate according to an embodiment of the present disclosure.

Step B14, referring to FIG. 5, an interlayer dielectric layer 133 and a source-drain metal layer are sequentially formed on the second gate 122. The source-drain metal layer includes an input electrode 151 and an output electrode 152.

The interlayer dielectric layer 133 covers the second gate 122, the second active layer 142, and the first insulation layer 131. The input electrode 151 is connected to the second contact portion 42*c*, and the output electrode 152 is connected to the first contact portion 42*b*.

In some embodiments, the interlayer dielectric layer 133 may be a single-layer or a multi-layer stacked structure, and its material may be $SiO_x$, $SiN_x$, $SiN_x/SiO_x$, $SiNO_x$, or the like.

The source-drain metal layer may be a single-layer or a multi-layer stacked structure. For example, the source-drain metal layer may be Mo, Mo/Al, Mo/Cu, MoTi/Cu, MoTi/Cu/MoTi, Ti/Al/Ti, Ti/Cu/Ti, Mo/Cu/IZO, IZO/Cu/IZO, or Mo/Cu/ITO, etc.

Then a step B15 is subjected.

Figure 6:
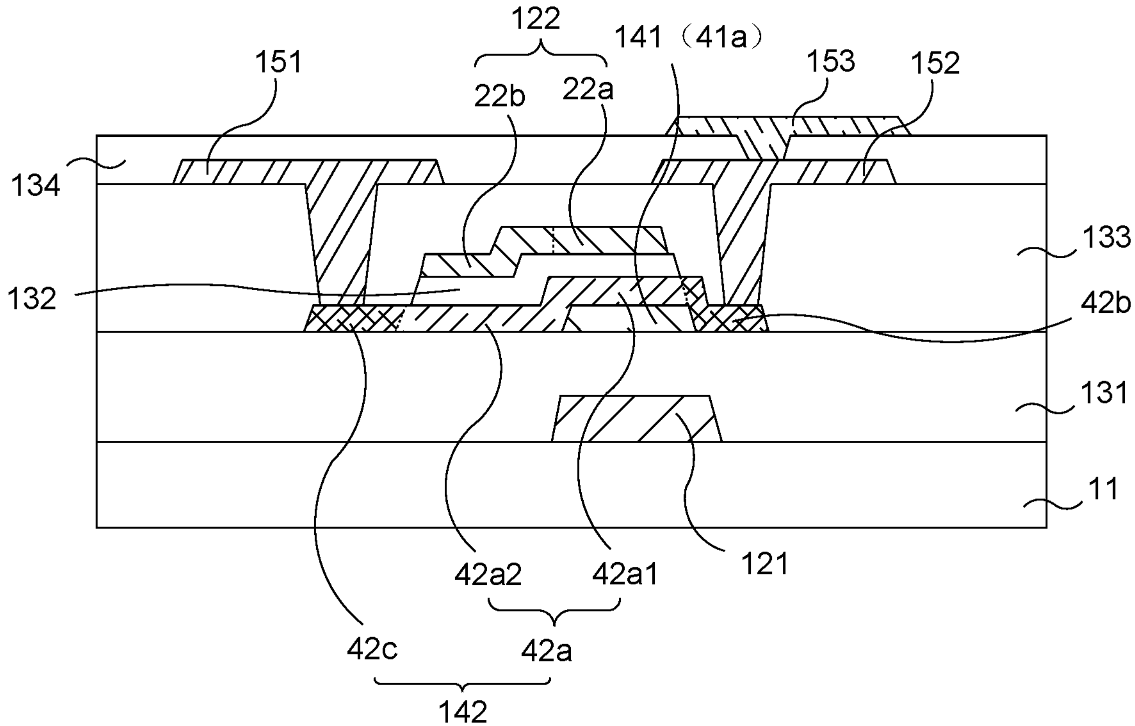
FIG. 6 is a schematic view of a structure corresponding to a step B15 of a manufacturing method of a drive substrate according to an embodiment of the present disclosure.

Step B15, referring to FIG. 6, a passivation layer 134 and a conductive layer 153 are sequentially formed on the source-drain metal layer.

The passivation layer 134 covers the source-drain metal layer and interlayer dielectric layer 133. The conductive layer 153 is connected to the output electrode 152.

In some embodiments, the passivation layer 134 may be a single-layer or a multi-layer stacked structure, and its material may be $SiO_x$, $SiN_x$, $SiN_x/SiO_x$, $SiNO_x$, or the like.

The conductive layer 153 may be a single-layer or a multi-layer stacked structure, and its material may be ITO, IZO, Cu, Al, Ag, Ti, Mo, Mo/Al, Mo/Cu, MoTi/Cu, MoTi/Cu/MoTi, Ti/Al/Ti, Ti/Cu/Ti, Mo/Cu/IZO, IZO/Cu/IZO, Mo/Cu/ITO, ITO/Ag/ITO, IZO/Ag/IZO, or the like.

In this way, the preparation process of the drive substrate 100 of the embodiment is completed.

Figure 7:
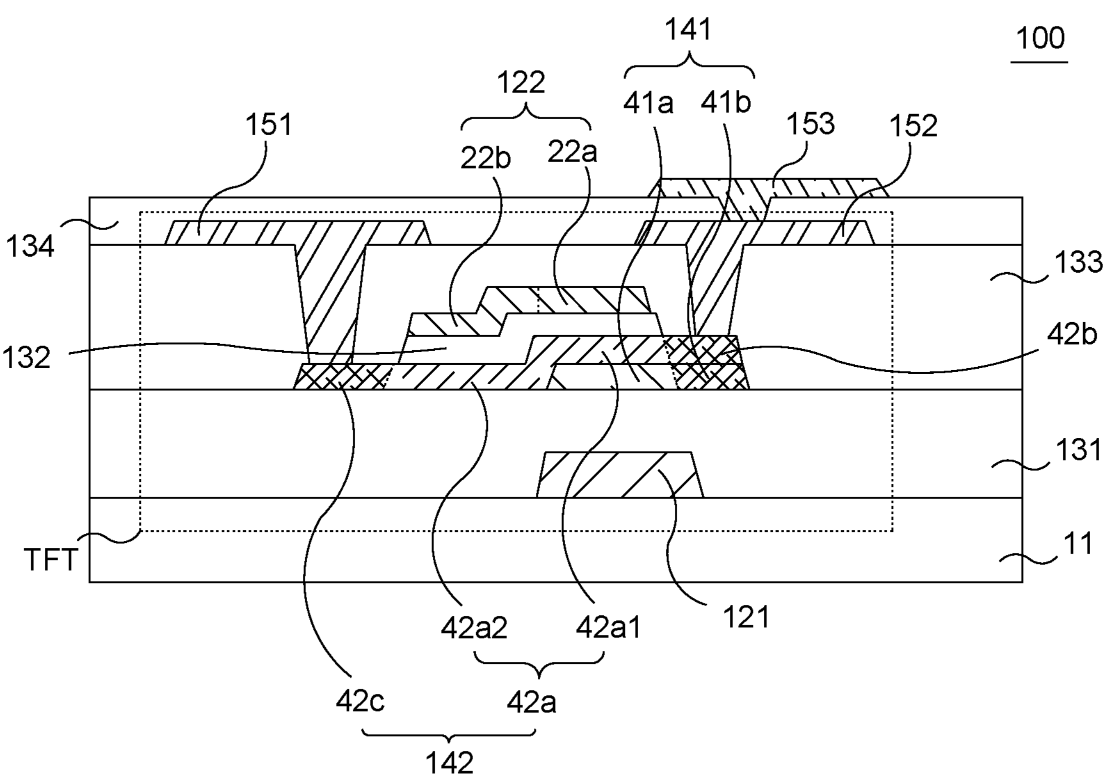
FIG. 7 is another structural schematic view of a drive substrate according to an embodiment of the present disclosure.

Referring to FIG. 7, compared with the above embodiment, another embodiment of the present disclosure is different from the above embodiment in that: the first active layer 141 further includes a third contact portion 41*b* connected to a side of the first channel 41*a*, and the first contact portion 42*b* is stacked on and connected to the third contact portion 41*b*.

In the embodiment, the first contact portion 42*b* and the third contact portion 41*b* are superimposed to improve the overall conductivity and reduce the resistance value of the device, which is beneficial to weaken the electric field of the area where the output electrode 152 is located, thereby suppressing the movement of the hot carriers.

In addition, the superposition of the first contact portion 42*b* and the third contact portion 41*b* reduces a depth of a hole, so that the output electrode 152 is more stably connected to the first contact portion 42*b*.

In some embodiments, a resistance value of the first contact portion 42*b* stacked with the third contact portion 41*b* as a whole is less than a resistance value of the second contact portion 42*c*. Such arrangement may further suppress the movement of the hot carriers.

In some embodiments, the drive substrate 100 further includes a photo-generated carrier injection portion disposed near a junction area of the first channel 41*a* and the first contact portion 42*b* and extending beyond the second gate 122.

The carriers provided by photo-generated carrier injection portion have a type different from that of the carriers in the first channel 41*a*, and the carriers in the first channel 41*a* and the carriers in the second channel 42*a* have the same type.

It should be noted that, the photo-generated carrier injection portion is introduced in the embodiment, so that carriers may be provided in time with a change of a gate voltage of the second gate 122, so as to suppress a formation of a non-equilibrium state in the area where the output electrode 152 is located, reduce an emission number of defect states in a pn junction depletion area at the first contact portion 42*b* and the first channel 41*a*, thereby suppressing the dynamic hot carrier effect.

Figure 8:
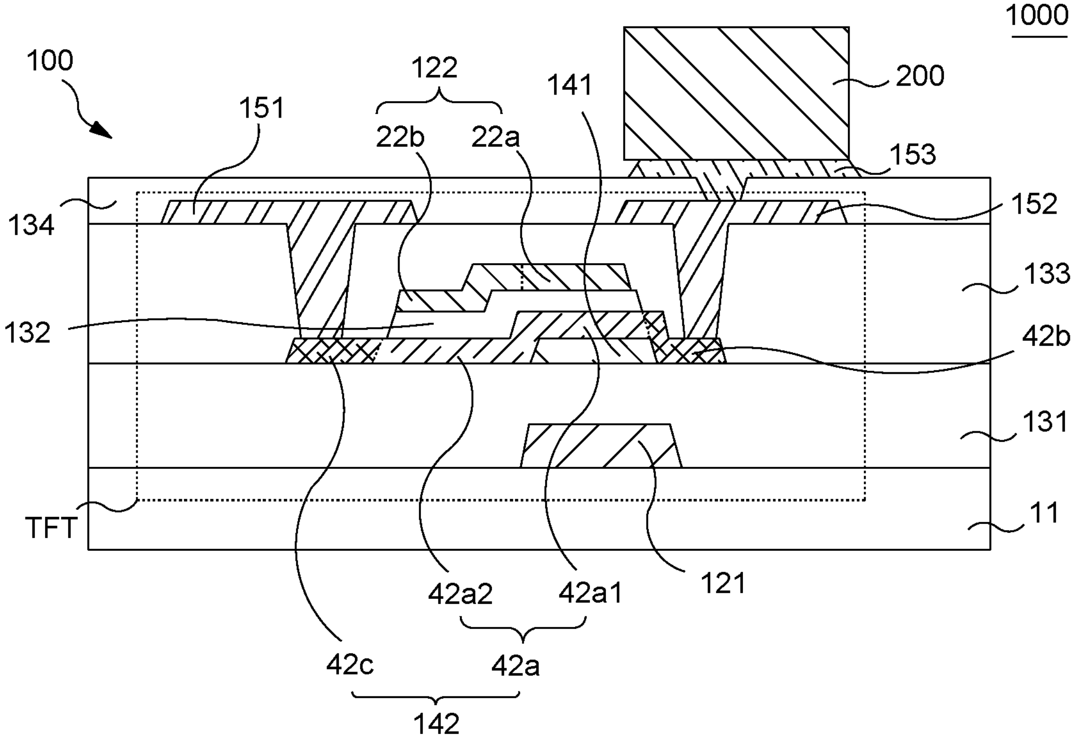
FIG. 8 is a structural schematic view of a display panel according to an embodiment of the present disclosure.

Correspondingly, referring to FIG. 8, a display panel 1000 is further provided according to embodiments of the present disclosure. The display panel 1000 includes the drive substrate 100 as in any of the above embodiments and a light emitting element 200 disposed on the drive substrate 100. The light emitting element 200 is connected to the output electrode 152.

The drive substrate 100 further includes a conductive layer 153 connected to the output electrode 152. The light emitting element 200 is bonded and connected to the conductive layer 153.

In some embodiments, the light emitting element 200 may be a submillimeter level light emitting diode, a micro light emitting diode, an organic light emitting diode, or the like.

It should be explained that the structure of the drive substrate 100 of the display panel 1000 in the embodiments is similar or identical to the structure of the drive substrate 100 in the above-mentioned embodiments, and will not be repeated here.

For the display panel 1000 of the embodiments of the present disclosure, in the thin film transistor TFT of the drive substrate 100, a structure with double-gate and double-active layer is formed by the first active layer 141, the first gate 121, the first sub-gate 22*a*, and a part of the second active layer 142 in an area adjacent to the output electrode 152, and a structure with single active layer and top gate is formed by the second sub-gate 22*b* and a part of the second active layer 142 in an area adjacent to the input electrode 151. Since the first gate 121 and the second gate 122 together control the first channel 41*a* of the first active layer 141 and the first portion 42*a*1 of the second channel 42*a* of the second active layer 142, a resistance and a voltage drop of the area are reduced, so that an electric field intensity of the area is weakened during operation, thereby suppressing the movement of the hot carriers and improving the stability of the threshold voltage (Vth) of the thin film transistor TFT.

The drive substrates and display panels according to embodiments of the present disclosure have been described above in detail. In this paper, specific examples are used to illustrate the principle and implementation of the invention. The description of the above embodiments is only used to help understand the method of the present disclosure and its core idea. Those skilled in the art can make various changes and modifications without departing from the spirit of the present disclosure. Therefore, the described embodiments are not intended to limit the present disclosure.

What is claimed is:

1. A drive substrate, comprising:
- a base;
- a first gate, disposed on the base;
- a first insulation layer, disposed on the base and covering the first gate;
- a first active layer, disposed on the first insulation layer and comprising a first channel overlapping the first gate;
- a second active layer, comprising a second channel, a first contact portion, and a second contact portion, wherein the second channel comprises a first portion and a second portion connected with each other; the first contact portion is connected to a side of the first portion away from the second portion, and the second contact portion is connected to a side of the second portion away from the first portion; the first portion is directly connected to the first channel; and the second portion and the first channel are both attached to the first insulation layer, and the second portion is disposed on a side of the first channel away from the first contact portion in a direction parallel to the first insulation layer;
- a second insulation layer, disposed on the second active layer;
- a second gate, disposed on the second insulation layer and comprising a first sub-gate and a second sub-gate connected with each other, wherein the first sub-gate overlaps the first portion, and the second sub-gate overlaps the second portion;
- an input electrode, connected to the second contact portion; and
- an output electrode, connected to the first contact portion.

2. The drive substrate according to claim 1, wherein the first contact portion and the first channel are both attached to the first insulation layer, and the first contact portion is connected to a lateral surface of the first channel.

3. The drive substrate according to claim 2, wherein based on an upper surface of the first insulation layer, the first contact portion is overlapped with the lateral surface of the first channel, and a height of the first contact portion 42*b* is greater than a height of the first channel 41*a*.

4. The drive substrate according to claim 1, wherein the first active layer further comprises a third contact portion connected to a side of the first channel, and the first contact portion is stacked on and connected to the third contact portion.

5. The drive substrate according to claim 2, wherein a resistance value of the first contact portion and a resistance value of the second contact portion are both less than a resistance value of the first channel and less than a resistance value of the second channel.

6. The drive substrate according to claim 5, wherein a doping concentration of the first contact portion is greater than a doping concentration of the second contact portion.

7. The drive substrate according to claim 1, wherein in an orthographic projection of the drive substrate, both of a projection of the first sub-gate and a projection of the first gate completely cover a projection of the first channel and a projection of the first portion.

8. The drive substrate according to claim 1, wherein a length of the first channel is 15% to 30% of a length of the second channel.

9. The drive substrate according to claim 1, wherein a carrier concentration of the first active layer is less than or equal to a carrier concentration of the second active layer.

10. The drive substrate according to claim 1, further comprising:
- a passivation layer, covering the input electrode and the output electrode; and
- a conductive layer, disposed on the passivation layer and connected to the output electrode.

11. A display panel, comprising:
- a drive substrate, comprising:
  - a base;
  - a first gate, disposed on the base;
  - a first insulation layer, disposed on the base and covering the first gate;
  - a first active layer, disposed on the first insulation layer and comprising a first channel overlapping the first gate;
  - a second active layer, comprising a second channel, a first contact portion, and a second contact portion, wherein the second channel comprises a first portion and a second portion connected with each other; the first contact portion is connected to a side of the first portion away from the second portion, and the second contact portion is connected to a side of the second portion away from the first portion; the first portion is directly connected to the first channel; and the second portion and the first channel are both attached to the first insulation layer, and the second portion is disposed on a side of the first channel away from the first contact portion in a direction parallel to the first insulation layer;

a second insulation layer, disposed on the second active layer;

a second gate, disposed on the second insulation layer and comprising a first sub-gate and a second sub-gate connected with each other, wherein the first sub-gate overlaps the first portion, and the second sub-gate overlaps the second portion;

an input electrode, connected to the second contact portion; and an output electrode, connected to the first contact portion; and a light emitting element, disposed on the drive substrate and connected to the output electrode.

12. The display panel according to claim 11, wherein the first contact portion and the first channel are both attached to the first insulation layer, and the first contact portion is connected to a lateral surface of the first channel.

13. The display panel according to claim 12, wherein based on an upper surface of the first insulation layer, the first contact portion is overlapped with the lateral surface of the first channel, and a height of the first contact portion 42*b* is greater than a height of the first channel 41*a*.

14. The display panel according to claim 11, wherein the first active layer further comprises a third contact portion connected to a side of the first channel, and the first contact portion is stacked on and connected to the third contact portion.

15. The display panel according to claim 12, wherein a resistance value of the first contact portion and a resistance value of the second contact portion are both less than a resistance value of the first channel and less than a resistance value of the second channel.

16. The display panel according to claim 15, wherein a doping concentration of the first contact portion is greater than a doping concentration of the second contact portion.

17. The display panel according to claim 11, wherein in an orthographic projection of the drive substrate, both of a projection of the first sub-gate and a projection of the first gate completely cover a projection of the first channel and a projection of the first portion.

18. The display panel according to claim 11, wherein a length of the first channel is 15% to 30% of a length of the second channel.

19. The display panel according to claim 11, wherein a carrier concentration of the first active layer is less than or equal to a carrier concentration of the second active layer.

20. The display panel according to claim 11, wherein the drive substrate further comprises:

a passivation layer, covering the input electrode and the output electrode; and a conductive layer, disposed on the passivation layer and connecting the light emitting element and the output electrode.

* * * * *